United States Patent
Du et al.

(10) Patent No.: US 9,231,535 B2
(45) Date of Patent: Jan. 5, 2016

(54) SILENT START CLASS-D AMPLIFIER

(71) Applicant: STMicroelectronics (Shenzhen) R&D Co. Ltd., Shenzhen (CN)

(72) Inventors: Ru Feng Du, Shenzhen (CN); Qi Yu Liu, Shenzhen (CN)

(73) Assignee: STMicroelectronics (Shenzhen) R&D Co. Ltd, Shenzhen (CN)

( * ) Notice: Subject to any disclaimer, the term of this patent is extended or adjusted under 35 U.S.C. 154(b) by 34 days.

(21) Appl. No.: 14/199,773

(22) Filed: Mar. 6, 2014

(65) Prior Publication Data

US 2014/0285258 A1 Sep. 25, 2014

(30) Foreign Application Priority Data

Mar. 22, 2013 (CN) .......................... 2013 1 0098383

(51) Int. Cl.
*H03F 3/38* (2006.01)
*H03F 3/217* (2006.01)

(52) U.S. Cl.
CPC ............ *H03F 3/2171* (2013.01); *H03F 3/2175* (2013.01)

(58) Field of Classification Search
CPC ................................ H03F 3/2171; H03F 3/38
USPC ..................................................... 330/251, 10
See application file for complete search history.

(56) References Cited

U.S. PATENT DOCUMENTS

| 5,805,020 | A | 9/1998 | Danz et al. |
| 7,791,427 | B2 | 9/2010 | Kost |
| 2005/0083115 | A1 | 4/2005 | Risbo |
| 2009/0160547 | A1* | 6/2009 | Shankar et al. ................. 330/10 |
| 2010/0232628 | A1 | 9/2010 | Zhang et al. |

* cited by examiner

*Primary Examiner* — Steven J Mottola
(74) *Attorney, Agent, or Firm* — Gardere Wynne Sewell LLP

(57) ABSTRACT

A Class-D amplifier includes a pre-amplifier having an input configured to receive an amplifier reference voltage signal which is ramped at start-up at a fast rate. An integrator has a first input configured to receive an input signal from the pre-amplifier and a second input configured to receive an integrator reference voltage signal which is ramped at start-up at a slower rate. A modulator has an input coupled to an output of the integrator. The modulator generates a pulse width modulated output signal. Operation of the Class-D amplifier is controlled at start-up by applying a slow ramped signal as the integrator reference voltage signal and a fast ramped signal as the amplifier reference voltage so that the pulse width modulated output signal exhibits an increasing change in duty cycle in response to an increasing voltage of the integrator reference voltage signal, and no "pop" is introduced at start-up.

18 Claims, 3 Drawing Sheets

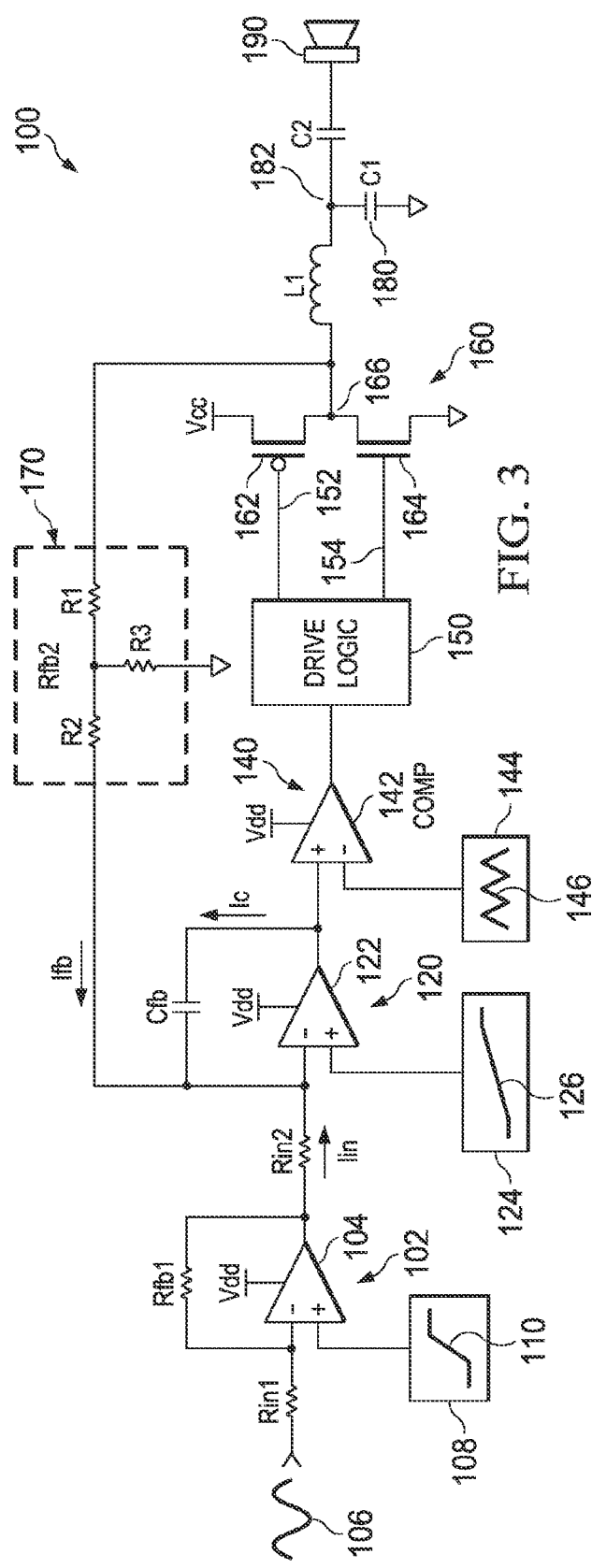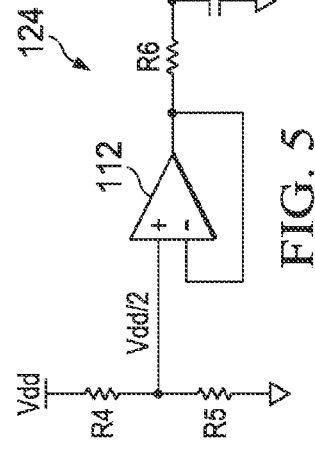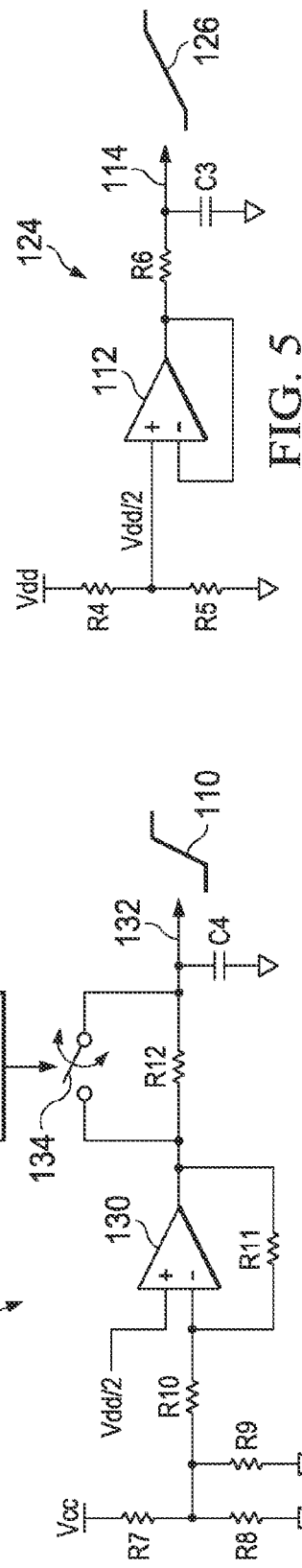

SILENT START CLASS-D AMPLIFIER

PRIORITY CLAIM

This application claims priority from Chinese Application for Patent No. 201310098383.6 filed Mar. 22, 2013, the disclosure of which is incorporated by reference.

TECHNICAL FIELD

The present invention relates to amplifier circuits and, in particular, to a Class-D type amplifier including a silent start functionality.

BACKGROUND

Reference is made to FIG. 1 which illustrates a circuit diagram for a conventional Class-D amplifier 10 operable to convert an input signal 12 (for example, an audio signal) into high-frequency pulses 14. A typical Class-D amplifier utilizes a pulse width modulator 18 to generate high-frequency pulses 14 that vary in width as a function of the amplitude of the input signal 12. The pulse width modulator 18 may typically comprise a comparator 19 having a first (positive) input receiving the input signal 12 and a second (negative) input receiving a sawtooth (or triangular) waveform reference 21. The varying-width pulses output from the pulse width modulator 18 are processed by a drive logic circuit 20 to produce opposite phase pulsed control signals 22 for application to the control terminals of transistor switches 16 arranged in a half-bridge configuration. An output of the transistor bridge is coupled through a low pass filter 24 (with a DC blocking capacitor) to a load 26 (in this case illustrated as a speaker for when the input signal is an audio signal). The lowpass filter 24 converts the pulses back into an amplified version of the input signal for application to the load. In an implementation, the filter 24 is formed of a conventional inductive/capacitive circuit, although more complex filtering circuitry could be used if desired.

Although a pulse width modulator 18 is illustrated as the circuit to convert the input signal into high-frequency pulses, it is known in the art to utilize other pulse modulation circuitry to process the audio input signal. For example, a pulse density modulator could be used.

With reference to FIG. 2, the conventional Class-D amplifier 10 may further include an integrator circuit 30. The integrator circuit 30 comprises an operational amplifier 32 having a first (negative) input coupled to receive the input signal 12 through an input resistor Rin. The second (positive) input of the operational amplifier 32 receives a fixed reference voltage Vref. The output of the operational amplifier is coupled to the input of the pulse width modulator 18, and is further coupled in a feedback circuit to the negative input of the operational amplifier 32 through a feedback capacitor Cfb. The fixed voltage Vref supplied to the positive input of the operational amplifier 32 is typically set equal to one-half of the supply voltage Vdd for the operational amplifier 32. The supply voltage Vdd is typically separate from, and at a different voltage level than, the supply voltage Vcc used by the transistor bridge.

In operation, the square-wave output of the switching power transistors at the transistor bridge is summed with the audio input at the negative input of the operational amplifier 32 to provide a negative feedback. This negative feedback is taken before the lowpass filter 24 (rather than after) so as to avoid the need in the feedback loop for a complicated compensation network to handle the phase shift introduced by the lowpass filter. A feedback resistor Rfb is accordingly coupled between the output of the transistor bridge and the negative input of the operational amplifier 32.

The square-wave output of the transistor bridge is synchronous with the audio input, but it is important to remove the carrier of the audio input signal. The integrator circuit 30 functions to sum the square-wave output and audio input signal. The integrator circuit 30 feeds the resultant error signal into the positive input of the duty cycle modulator 18. The comparator circuit of the modulator 18 accordingly compares the triangle waveform reference to the error signal and produces the modulated output as a square wave whose duty cycle is proportional to the amplitude of the audio input signal.

In order to properly drive the transistor bridge circuit, the drive logic 20 converts the modulated output to drive signals for driving the upper and lower power switches of the transistor bridge in an antiphase relationship. The drive logic 20 will accordingly drive one switch of the bridge into saturation while the other switch of the bridge is cut off (and vice versa). As those skilled in the art know, the combination of switching and conduction losses for the transistor bridge defines the upper bound of the amplifier's efficiency. The square wave of the modulated output causes the bridge switches to change state as fast as possible. Fast switching is desired because it limits the time that the bridge switches spend in the linear operating region, thereby increasing efficiency and reducing heat generation.

The lowpass filter 24 functions to filter out the high-frequency square wave that the power switches of the transistor bridge generate. This leaves only an amplified version of the input audio signal to drive the load.

Those skilled in the art recognize that Class-D amplifiers produce a noticeable "pop" at the speaker load when power to the amplifier is first turned on. It is important to maintain fidelity in the output signal with respect to the input audio signal. The presence of any artifact, such as the "pop" at power on, in the output signal is unacceptable.

While a number of solutions to the start-up artifact problem are known in the art, many of these solutions are expensive, unduly complex or may introduce other problems (including artifacts). There is a need in the art to provide an inexpensive and efficient solution to the start-up artifact problem associated with conventional Class-D amplifiers.

SUMMARY

In an embodiment, a Class-D amplifier circuit comprises: an integrator having a first input configured to receive an input signal and a second input configured to receive a reference voltage signal; a first ramp generator configured to generate an integrator ramp signal at amplifier start-up, said integrator ramp signal applied as the reference voltage signal to the second input of the integrator; a modulator circuit having an input coupled to an output of the integrator; a transistor bridge circuit configured to be driven in response to a modulation signal output from the modulator circuit; and a feedback loop coupling an output of the transistor bridge to the first input of the integrator. The amplifier further includes a pre-amplifier circuit configured to generate said input signal, where the pre-amplifier circuit has a first input configured to receive a signal from which the input signal is derived and has a second input configured to receive a reference voltage signal, and a second ramp generator configured to generate an amplifier ramp signal at amplifier start-up, said amplifier ramp signal applied as the reference voltage signal to the second input of the pre-amplifier circuit.

In an embodiment, a method for operating a Class-D amplifier at amplifier start-up is presented. The Class-D amplifier includes an integrator having a first input configured to receive an input signal and a second input configured to receive a reference voltage signal. The method comprises: generating an integrator ramp signal at amplifier start-up; and applying said integrator ramp signal as the reference voltage signal to the second input of the integrator. The method further includes generating an amplifier ramp signal at amplifier start-up and applying said amplifier ramp signal as the reference voltage signal to a pre-amplifier circuit.

In an embodiment, a Class-D amplifier circuit comprises: an integrator having a first input configured to receive an input signal and a second input configured to receive an integrator reference voltage signal; a modulator circuit having an input coupled to an output of the integrator, said modulator circuit generating a pulse width modulated output signal; and a start-up circuit configured to ramp-up the integrator reference voltage signal in response to amplifier start-up so that said pulse width modulated output signal exhibits an increasing change in duty cycle in response to an increasing voltage of the integrator reference voltage signal. The circuit further includes a pre-amplifier circuit configured to generate said input signal, where the pre-amplifier circuit has a first input configured to receive a signal from which the input signal is derived and has a second input configured to receive an amplifier reference voltage signal, the start-up circuit further configured to ramp-up the amplifier reference voltage signal at a rate faster than the integrator reference voltage signal.

In an embodiment, a method for operating a Class-D amplifier comprises: integrating an input signal with an integrator circuit having an input configured to receive an integrator reference voltage signal; modulating the integrated input signal to generate a pulse width modulated output signal; and operating the Class-D amplifier at start-circuit by ramping up the integrator reference voltage signal so that said pulse width modulated output signal exhibits an increasing change in duty cycle in response to an increasing voltage of the integrator reference voltage signal. The method further includes pre-amplifying a signal with an amplifier to generate said input signal, said amplifier having an input configured to receive an amplifier reference voltage signal, and further operating the Class-D amplifier at start-circuit by ramping up the amplifier reference voltage signal at a rate faster than the integrator reference voltage signal.

BRIEF DESCRIPTION OF THE DRAWINGS

For a better understanding of the embodiments, reference will now be made by way of example only to the accompanying figures in which:

FIG. 3 is a circuit diagram of a Class-D amplifier with silent start;

FIG. 4 illustrates a circuit diagram for an amplifier ramp voltage reference;

FIG. 5 illustrates a circuit diagram for an integrator ramp voltage reference.

DETAILED DESCRIPTION OF THE DRAWINGS

Figure 1:
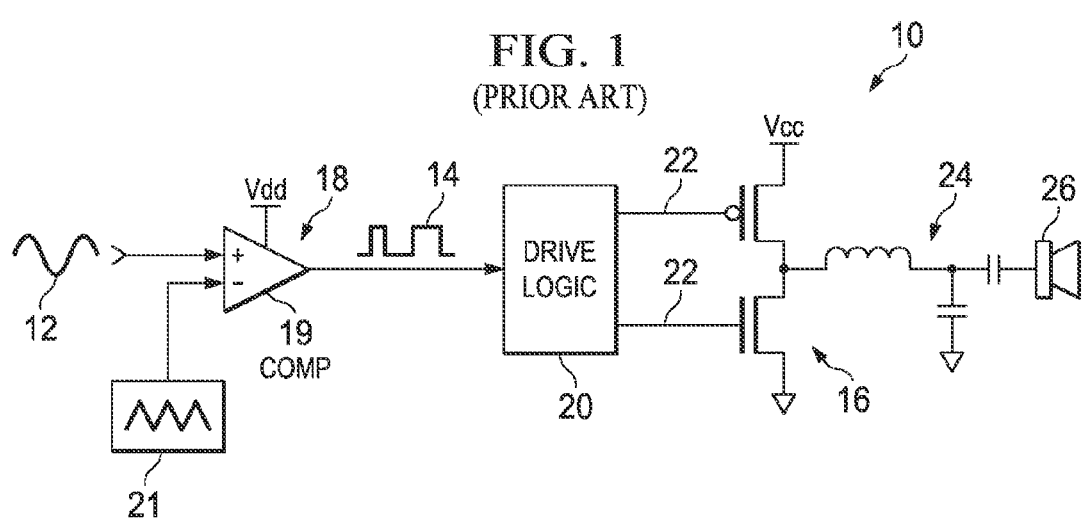
FIGS. 1 and 2 illustrate conventional Class-D amplifier circuit configurations.
Figure 2:
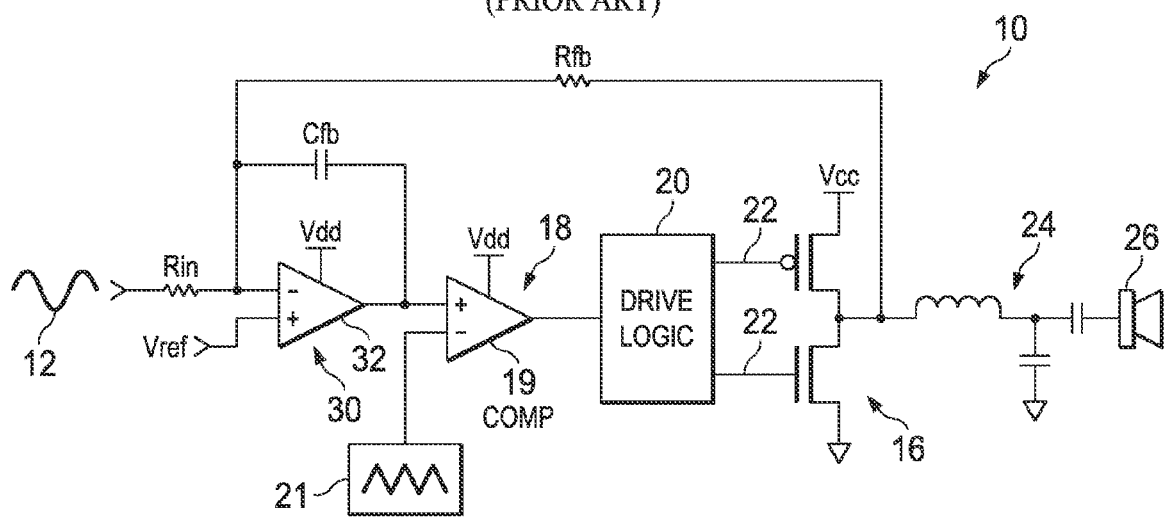

Reference is now made to FIG. 3 which shows a circuit diagram of a Class-D amplifier 100 with silent start.

The amplifier 100 includes a preamplifier circuit 102 comprising an operational amplifier 104 having a first (negative) input coupled through an input resistor Rin1 to receive an input signal 106 (for example, an audio signal) and a second (positive) input coupled to receive the output signal from an amplifier ramp voltage reference 108. A feedback resistor Rfb1 is coupled between an output of the operational amplifier 104 and the negative input.

The amplifier 100 further includes an integrator circuit 120 comprising an operational amplifier 122 having a first (negative) input coupled through an input resistor Rin2 to receive the pre-amplified input signal 106 from the output of operational amplifier 104 and a second (positive) input coupled to receive the output signal from an integrator ramp voltage reference 124. A feedback capacitor Cfb is coupled between an output of the operational amplifier 122 and the negative input.

The amplifier 100 further includes a modulator circuit 140 comprising a comparator 142 having a first (positive) input coupled to the output of the operational amplifier 122 (to receive the pre-amplified and integrated input signal 106) and a second (negative) input coupled to receive the output signal from a sawtooth (or triangular) waveform reference 144. The modulator 140 functions to generate a modulated output which takes the form of a square wave whose duty cycle is proportional to the amplitude of the input signal 106.

The amplifier 100 further includes a drive logic circuit 150 having an input coupled to the output of the comparator 142 and a plurality of outputs. The drive logic 150 functions to convert the modulated output signal received from the modulator circuit 140 into antiphase drive signals 152 and 154.

The amplifier 100 further includes a transistor bridge circuit 160 comprising a first drive transistor 162 (for example, a p-channel MOSFET) and a second drive transistor 164 (for example, an n-channel MOSFET). The first and second drive transistors are connected in a half-bridge configuration with their source-drain circuit paths coupled in series at an output node 166. A source node of the first drive transistor 162 is coupled to a high supply node associated with a high voltage supply reference Vcc. A source node of the second drive transistor 164 is coupled to a low supply node associated with a low voltage supply reference (for example, ground, or −Vcc). The drains of the first and second drive transistors are coupled together at the output node 166.

The amplifier 100 further includes a feedback circuit 170 coupled between the output node 166 and the negative input node of the operational amplifier 122. The feedback circuit 170 presents a feedback resistance Rfb2. The feedback resistance is defined by a resistive circuit formed by resistors R1, R2 and R3. Resistors R1 and R3 are connected in series to form a voltage divider circuit. Resistor R2 is coupled between the tap node of the voltage divider circuit and the negative input of the operational amplifier 122. The resistance presented by the feedback resistance Rfb2 may be calculated as follows:

$$Rfb2=(n+1)R2+nR3, \text{ where } R1=nR3.$$

The amplifier 100 further includes a lowpass filter circuit 180. The lowpass filter circuit 180 may comprise any suitable analog filter design. In an exemplary embodiment, the lowpass filter is formed by an inductor L1 and capacitor C1 coupled in series between the output node 166 and the low supply node associated with the low voltage supply reference.

The amplifier 100 further includes an output capacitor C2 coupled between the connection node 182 for the series connected inductor L1 and capacitor C1 and a load 190 to be driven by the amplifier. The output capacitor C2 functions as a DC blocking capacitor. The load 190 may comprise any suitable load, and in exemplary implementation comprises a speaker as the input signal in the exemplary implementation may comprise an audio signal.

With respect to stability of the amplifier 100, the loop transfer H(s) is given by the following:

$$H(s)=Vout/Vin=Gpwm/(s*Rfb2*Cfb),$$

where Gpwm is the gain reflected by the ratio of Vcc to Vt (i.e., Vcc/Vt), where Vt is the voltage difference between the maximum voltage and minimum voltage of the sawtooth (or triangular) waveform signal 146 generated by the reference 144.

The slope of the sawtooth (or triangular) waveform signal 146 should preferably be greater than the slope of the output signal from the integrator circuit 120. In other words:

$$dV146/dt > dVo120/dt,$$

where V146 is the voltage of sawtooth (or triangular) waveform signal 146 and Vo120 is the voltage at the output of integrator circuit 120.

It will also be noted that the slope of the output signal from the integrator circuit 120 is given by:

$$dVo120/dt=Ic/Cfb$$

The modulation depth becomes 100% when the input current Iin to the operational amplifier 122 equals the feedback current Ifb at the negative input of the operational amplifier 122. In this case, the charge/discharge current Ic of the feedback capacitor Cfb is at maximum. Consequently, the criterion for stability of the feedback loop becomes:

$$dV146/dt > Vcc/(Rfb2*Cfb)$$

because: $Ic(max)=Vcc/Rfb2$

With respect to DC balance and silent start, when the input signal is zero, the output at the load needs to be biased at Vcc/2. This is the requirement for DC balance. The amplifier ramp voltage reference 108 and integrator ramp voltage reference 124 are generated to achieve the desired balance.

In accordance with Kirchhoff's law, the average of the output voltage Vout is given by:

$$Vout=N*V124(1+(n+1)/N)-N*V108$$

Where Vout is the average of V166 or V182 in FIG. 3, and V108 is the voltage of the amplifier ramp voltage signal 110 generated by reference 108, V124 is the voltage of the integrator ramp voltage signal 126 generated by reference 124, n=R1/R3, and N=Rfb2/Rin2. The feedback resistance of Rfb2 is implemented as a resistor network as shown with Rfb2=(n+1)R2+nR3, where R1=nR3.

In order to bias the output at Vcc/2 with respect to an audio input signal at zero volts, the maximum values of the voltage of the amplifier ramp voltage signal 110 and integrator ramp voltage signal 126 must be as follows:

$$V126(max)=Vdd/2$$

$$V110(max)=Vdd(½+(n+1)/(2N))-Vcc/(2N)$$

Reference is now made to FIG. 4 which illustrates a circuit diagram for the amplifier ramp voltage reference 108. The circuit for the amplifier ramp voltage reference 108 includes a resistor R7 and a resistor R8 connected in series as a voltage divider. A resistor R9 is connected in parallel with the resistor R8. The resistors R7 and R8 have resistance values equal to 2*R1. The resistor R9 has a resistance value equal to R3. An operational amplifier 130 includes a first (positive) input coupled to receive the voltage Vdd/2. A second (negative) input of the operational amplifier 130 is coupled through resistor R10 to the tap node of the R7/R8 voltage divider. The resistor R10 has a resistance equal to R2. An output of the operational amplifier 130 is coupled to the negative input of the operational amplifier 130 through a feedback resistor R11. The resistor R11 has a resistance equal to Rin2. A resistor R12 is coupled between the output of the operational amplifier 130 and an output node 132 of the reference 124. A capacitor C4 is coupled between the output node 132 and the low supply node associated with the low voltage supply reference. A switch circuit 134 is coupled in parallel with the resistor R12. The switch circuit 134 is controlled by a control circuit 136.

With the illustrated circuit configuration, the output node 132 generates the amplifier ramp voltage signal 110 having a maximum voltage value of V110(max)=Vdd(½+(n+1)/(2N))-Vcc/(2N). The suitable value C4 and R12 coupled at the output node 132 will introduce good enough PSRR (power supply rejection ratio) performance of reference signal 110. The switch 134 functions to short around the resistor R12 and provide a fast charge of amplifier ramp voltage signal 110 to its maximum voltage value. The switch 134 is controlled by the control circuit 136 and works in this way: the switch 134 shorts R12 when Vdd power applied, and charges V110 quickly. The switch 134 will be opened when V110 has been fast charged near to its maximum value. In this way, the delay time td1, V110 taking to reach its maximum voltage value, will be very small (for example: several to tens of microseconds).

Reference is now made to FIG. 5 which illustrates a circuit diagram for the integrator ramp voltage reference 124. The circuit for the integrator ramp voltage reference 124 includes a resistor R4 and a resistor R5 connected in series as a voltage divider. The resistances of resistors R4 and R5 are preferably equal so as to output from the divider tap node a voltage equal to Vdd/2. An operational amplifier 112 includes a first (positive) input coupled to the resistive divider tap node to receive the voltage Vdd/2. The Vdd/2 output from the R4/R5 voltage divider tap node may be applied as well to the positive input of the operational amplifier 130 in FIG. 4. An output of the operational amplifier 112 is shunt connected to a second (negative) input of the operational amplifier 112 to form a unitary gain voltage buffer. A resistor R6 is coupled between the output of the operational amplifier 112 and an output node 114 of the reference 124. A capacitor C3 is coupled between the output node 114 and the low supply node associated with the low voltage supply reference.

With the illustrated circuit configuration, the output node 114 generates the integrator ramp voltage signal 126 having a maximum voltage value of V126(max)=Vdd/2. The capacitor C3 coupled at the output node 114 will introduce a slew in the rise of the integrator ramp voltage signal 126 delaying the signal from reaching the maximum voltage value for a time delay td2 (set by the time constant of R6 and C3) after Vdd power has been applied.

With reference to FIGS. 4 and 5, the values of R6, R12, C3 and C4, and control circuit 136 of switch 134 are selected to ensure the correct timing sequence and time delays td1 and td2 relative to times t1, t2 and t3 in order to ensure correct start up and suppression of the "pop" noise as described above.

The time delay td1 and the time delay td2 are controlled to implement a certain start-up sequence for the amplifier 100. Specifically, td1<td2 and more specifically, td1<<td2. With this configuration, the amplifier ramp voltage signal 110 will rise to its maximum voltage value before the integrator ramp voltage signal 126 rises to its threshold voltage value (=V108(max)/(1+(1+n)/N), and the output will be kept in zero before this point. If this occurs, the "pop" noise during the start-up transient will be suppressed. In an exemplary implementation, td1 is on the order of a several to a few tens of microseconds and td2 in on the order of a few tens of milliseconds (for example, greater than or equal to about 60 ms). Through use of switch 134, the amplifier ramp signal V110 is fast charged to its maximum voltage value before time t2.

Figure 6:
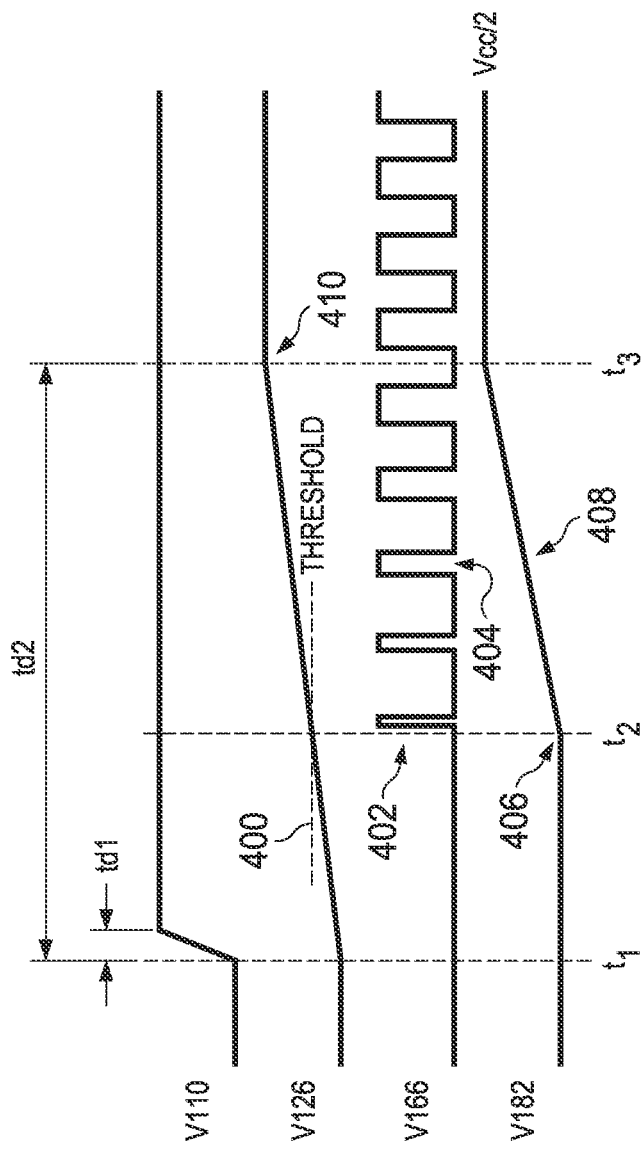
FIG. 6 illustrates waveforms for start-up operation of the amplifier of FIG. 3.

Reference is now made to FIG. 6 which illustrates waveforms for start-up operation of the amplifier 100. At time t1, Vcc and Vdd power is applied to the amplifier 100 and the amplifier enters start-up (with the signals V110 and V126 both starting to rise). The amplifier ramp voltage signal 110 begins to rise at time t1 and rises to its maximum voltage value within the time delay td1. The integrator ramp voltage signal 126 begins its rise at time t1 and rises towards its maximum voltage value taking the time delay td2. It will be noted that the time delay td1 is substantially shorter than the time delay td2 and must be completed by time t2. When the rising integrator ramp voltage signal 126 reaches a threshold 400 (=V108(max)/(1+(1+n)/N), the modulator circuit 140 begins to generate the modulated signal (reference 402). Before that point in time, the output is kept at zero. As the integrator ramp voltage signal 126 continues to rise, the output V182 will slowly rise from very small toward Vcc/2. Thus, the duty cycle of the PWM signal V166 output from the modulator circuit 140 initially has a low duty cycle, and the signal V182 at the output of the low pass filter 180 is low (reference 406). As the integrator ramp voltage signal 126 continues to rise towards its maximum value, the duty cycle of the PWM output signal correspondingly increases (reference 404), and the signal V182 at the output of the low pass filter 180 correspondingly rises (reference 408). The integrator ramp voltage signal 126 finally reaches its maximum value at the end of time delay td2 (reference 410), and at this point the PWM output signal has a 50% duty cycle and the signal at the output of the low pass filter 180 has risen to one-half of the Vcc supply voltage. Because of the increase in the amplifier and integrator ramp references and the gradual increase of the duty cycle of the PWM output signal (due to the slowly rising integrator ramp voltage signal 126) there is no "pop" or artifact introduced in the signal at the output of the low pass filter 180.

Although the transistor bridge is illustrated as a half-bridge circuit, it will be understood that the configuration and operation of the amplifier 100 is equally applicable to full bridge designs.

The invention is further applicable to bridge tied-load (BTL) type Class-D amplifiers as "pop" noise is a potential issue due to branch mismatch.

The foregoing description has been provided by way of exemplary and non-limiting examples of a full and informative description of the exemplary embodiment of this invention. However, various modifications and adaptations may become apparent to those skilled in the relevant arts in view of the foregoing description, when read in conjunction with the accompanying drawings and the appended claims. However, all such and similar modifications of the teachings of this invention will still fall within the scope of this invention as defined in the appended claims.

What is claimed is:

1. A Class-D amplifier circuit, comprising:
    a pre-amplifier circuit having a first input configured to receive a signal and a second input configured to receive an amplifier reference voltage signal, said pre-amplifier circuit configured to generate an input signal in response to the received signal;
    an integrator having a first input configured to receive said input signal and a second input configured to receive an integrator reference voltage signal;
    a first ramp generator configured to generate an integrator ramp signal at amplifier start-up, said integrator ramp signal applied as the integrator reference voltage signal to the second input of the integrator;
    a second ramp generator configured to generate an amplifier ramp signal at amplifier start-up, said amplifier ramp signal applied as the amplifier reference voltage signal to the second input of the pre-amplifier circuit;
    a modulator circuit having an input coupled to an output of the integrator;
    a transistor bridge circuit configured to be driven in response to a modulation signal output from the modulator circuit; and
    a feedback loop coupling an output of the transistor bridge to the first input of the integrator.

2. The Class-D amplifier circuit of claim 1, wherein the integrator ramp signal has a rise time to a maximum value on the order of a few tens of milliseconds.

3. The Class-D amplifier circuit of claim 1, wherein the integrator ramp signal has a rise time that is longer than a rise time of the amplifier ramp signal.

4. The Class-D amplifier circuit of claim 1, wherein the integrator ramp signal has a rise time to a maximum value on the order of a few tens of milliseconds.

5. The Class-D amplifier circuit of claim 4, wherein the amplifier ramp signal has a rise time to a maximum value on the order of several microseconds.

6. The Class-D amplifier circuit of claim 5, wherein the maximum value of the amplifier ramp signal is derived from a high supply voltage for the transistor bridge.

7. The Class-D amplifier circuit of claim 6, wherein the maximum value of the integrator ramp signal is derived from a high supply voltage for the integrator.

8. A method for operating a Class-D amplifier at amplifier start-up, wherein said Class-D amplifier includes an integrator having a first input configured to receive an input signal and a second input configured to receive an integrator reference voltage signal, and further includes a pre-amplifier circuit configured to generate said input signal, the pre-amplifier circuit having a first input configured to receive a signal from which the input signal is derived and having a second input configured to receive an amplifier reference voltage signal, the method comprising:
    generating an integrator ramp signal at amplifier start-up;
    generating an amplifier ramp signal at amplifier start-up;
    applying said amplifier ramp signal as the amplifier reference voltage signal to the second input of the pre-amplifier circuit; and
    applying said integrator ramp signal as the integrator reference voltage signal to the second input of the integrator.

9. The method of claim 8, wherein the integrator ramp signal has a rise time to a maximum value on the order of a few tens of milliseconds.

10. The method of claim 8, wherein the integrator ramp signal has a rise time that is longer than a rise time of the amplifier ramp signal.

11. The method of claim 8, wherein the integrator ramp signal has a rise time to a maximum value on the order of a few tens of milliseconds.

12. The method of claim 11, wherein the amplifier ramp signal has a rise time to a maximum value on the order of several microseconds.

13. The method of claim 12, wherein the maximum value of the amplifier ramp signal is derived from a high supply voltage for the transistor bridge.

14. The method of claim 13, wherein the maximum value of the integrator ramp signal is derived from a high supply voltage for the integrator.

15. A Class-D amplifier circuit, comprising:
- a pre-amplifier circuit configured to generate an input signal, the pre-amplifier circuit having a first input configured to receive a signal from which the input signal is derived and having a second input configured to receive an amplifier reference voltage signal;
- an integrator having a first input configured to receive said input signal and a second input configured to receive an integrator reference voltage signal;
- a modulator circuit having an input coupled to an output of the integrator, said modulator circuit generating a pulse width modulated output signal; and
- a start-up circuit configured to ramp-up the integrator reference voltage signal in response to amplifier start-up so that said pulse width modulated output signal exhibits an increasing change in duty cycle in response to an increasing voltage of the integrator reference voltage signal, wherein said start-up circuit is further configured to ramp-up the amplifier reference voltage signal at a rate faster than the integrator reference voltage signal.

16. The Class-D amplifier circuit of claim 15, wherein the increasing voltage of the integrator reference voltage signal has a rise time to a maximum value on the order of a few tens of milliseconds.

17. The Class-D amplifier circuit of claim 15, wherein the integrator reference voltage signal has a rise time to a maximum value on the order of a few tens of milliseconds and the amplifier reference voltage signal has a rise time to a maximum value on the order of several microseconds.

18. A method for operating a Class-D amplifier, comprising:
- pre-amplifying a signal with an amplifier to generate an input signal, said amplifier having an input configured to receive an amplifier reference voltage signal;
- integrating said input signal with an integrator circuit having an input configured to receive an integrator reference voltage signal;
- modulating the integrated input signal to generate a pulse width modulated output signal;
- operating the Class-D amplifier at start-circuit by ramping up the integrator reference voltage signal so that said pulse width modulated output signal exhibits an increasing change in duty cycle in response to an increasing voltage of the integrator reference voltage signal; and
- further operating the Class-D amplifier at start-circuit by ramping up the amplifier reference voltage signal at a rate faster than the integrator reference voltage signal.

* * * * *